United States Patent [19]

Whitney

[11] Patent Number: 5,446,295

[45] Date of Patent: Aug. 29, 1995

[54] SILICON CONTROLLED RECTIFIER WITH A VARIABLE BASE-SHUNT RESISTANT

[75] Inventor: David Whitney, San Jose, Calif.

[73] Assignee: Siemens Components, Inc., Iselin, N.J.

[21] Appl. No.: 110,608

[22] Filed: Aug. 23, 1993

[51] Int. Cl.⁶ .......................................... H01L 29/74
[52] U.S. Cl. .................. 257/113; 257/122; 257/124; 257/154; 257/162
[58] Field of Search ............... 257/107, 113, 114, 115, 257/118, 121, 122, 124, 154, 162, 132, 133, 139, 140, 146, 147, 155; 307/570, 630, 631

[56] References Cited

U.S. PATENT DOCUMENTS

| 4,489,340 | 12/1984 | Ueda et al. | 257/115 |
| 4,604,638 | 8/1986 | Matsuda | 257/114 |
| 4,717,947 | 1/1988 | Matsuda et al. | 257/115 |
| 4,947,226 | 8/1990 | Huang et al. | 257/124 |

FOREIGN PATENT DOCUMENTS

| 57-71178 | 5/1982 | Japan | 257/124 |
| 58-21867 | 2/1983 | Japan | 257/114 |

*Primary Examiner*—Rolf Hille
*Assistant Examiner*—Minhloan Tran
*Attorney, Agent, or Firm*—Joseph S. Codispoti

[57] ABSTRACT

An optically triggered silicon controlled rectifier (SCR) circuit (20) has a number of semiconductor layers diffused into an N− substrate (21). The layers form an SCR (50) having a P+ anode region (25), a P+ gate region (24), and an N+ cathode region (27). An adjustable base-shunt resistance, in the form of a P− channel depletion mode MOSFET (Q3), connects between the SCR gate region and the cathode region. The MOSFET includes a MOSFET gate region (35), a P+ drain region (24), a P− − channel (26), and a P+ source region (23). The substrate also accommodates a PN photodiode (22, D1) which connects to the MOSFET gate region for switching the MOSFET on and off in response to incident optical radiation (L) thereon. The SCR gate region also comprises photosensitive material. When sufficient optical radiation illuminates the photodiode and the SCR gate region, the MOSFET is turned off and the SCR is triggered, permitting anode-to-cathode current to flow. When insufficient optical radiation is present, the MOSFET is turned on and provides a low-resistance shunt path which prevents the SCR gate region from triggering the SCR.

18 Claims, 1 Drawing Sheet

SILICON CONTROLLED RECTIFIER WITH A VARIABLE BASE-SHUNT RESISTANT

BACKGROUND OF THE INVENTION

1. Field of the Invention

The invention relates to the field of solid state electronics, and particularly, the invention relates to a method of fabricating an improved silicon controlled rectifier (SCR) in an integrated circuit (IC), and an improved SCR so formed.

2. Description of the Existing Art

In general, a silicon controlled rectifier (SCR) is a unidirectional semiconductor device which is primarily used for bistable switching. Such SCRs may be fabricated as discrete components or as part of an integrated circuit (IC). Specifically, an SCR is a four-layer device having three PN junctions. Three terminals, anode, cathode and gate, each conductively connects to a corresponding layer of the SCR.

With no voltage applied to the gate terminal, a typical SCR remains off for all values of forward voltage, i.e., positive anode-to-cathode voltage, below a certain voltage level (value) known as the breakover voltage. However, once the breakover voltage is exceeded by the forward voltage, the SCR conducts current from the anode terminal to the cathode terminal. Typically, this current, known as forward current, is limited by a limiting resistor connected in series with the SCR anode or cathode terminal. Once the SCR begins conducting current, a small forward voltage produces a large forward current, and this large forward current continues to flow through the SCR as long as the forward current does not fall below a minimum current known as the holding current. In contrast, when an SCR is reverse biased, i.e., when the anode-to-cathode voltage is negative and there is no gate voltage or the gate terminal is an open circuit, the SCR does not conduct current.

In general, a relationship exists between forward voltage and forward current of an SCR. This relationship varies as a positive voltage is applied to the gate terminal of the SCR. Specifically, as gate current increases due to an increasing positive voltage being applied to the gate terminal, the breakover voltage decreases to a lower value of forward voltage than that which occurs without a gate current present. Consequently, for any given value of gate current, a particular forward breakover voltage must be attained before the SCR will conduct. Therefore, SCR operation depends on both gate current and forward voltage. An SCR is said to have been "triggered" when sufficient gate current is generated to permit forward current to flow through the SCR, i.e., when the breakover voltage falls below an applied, fixed value of forward voltage.

In a typical application, a control circuit is connected to the SCR to regulate triggering. Some SCR control circuits include a shunt resistor which connects between the gate terminal and the cathode terminal. The shunt resistor is a variable resistor which controls triggering by regulating the amount of gate current. Typically, the shunt resistor valve is conventionally controlled by electrical or optical control signals being applied to the shunt resistor. For example, given an SCR with a fixed forward voltage, when the shunt resistor has a relatively low, e.g., tens of ohms, or zero resistance value, the shunt resistor "holds off" SCR triggering by essentially clamping the gate voltage to the cathode voltage. With the gate voltage clamped, the flow of gate current is zero or nearly zero and the SCR will not trigger. Consequently, forward current is also zero since, without gate current, the breakover voltage is a relatively high voltage value, i.e., the breakover voltage is presently larger than the forward voltage that will cause the SCR to conduct. However, when the shunt resistor has a relatively high resistance value, e.g., millions of ohms, SCR triggering occurs easily because gate current readily flows in response to relatively small positive gate voltages. Due to the flow of gate current, the breakover voltage decreases to a value below the applied forward voltage, thus, the SCR conducts forward current.

Although existing SCR control circuits have served the purpose, they have not proved entirely satisfactory for at least two reasons. First, adjustable shunt resistors that are used for trigger control in most existing SCR control circuits are fabricated as discrete devices external to the SCR. As such, apparatus using such circuits have been relatively expensive to fabricate, i.e., these circuits require many discrete components rather than a single integrated circuit. Second, those shunt resistors that are fabricated as an integrated part of the SCR are typically fixed value resistors and, consequently, they do not perform trigger-control functions. Such fixed value resistors simply establish a fixed value of gate current at which the SCR triggers. In these applications, the value of gate voltage controls SCR triggering. As such, triggering the SCR using optical radiation is not possible without additional componentry.

Thus, a need exists in the art for an improved SCR having an adjustable value shunt resistor integrated into an IC and a method of fabricating such an improved SCR.

SUMMARY OF THE INVENTION

To remedy the deficiencies in the art, the present invention teaches an improved silicon controlled rectifier (SCR) that forms part of an integrated circuit (IC) that includes a variable shunt resistor for SCR trigger control. Furthermore, the invention includes an IC having an SCR containing semiconductor switches capable of being controlled by signals generated external of the IC.

In general, the present invention is an improved SCR containing an adjustable shunt resistor formed upon a single semiconductor substrate. When adjusted to a high-resistance state, the shunt resistor causes the SCR to conduct forward current in response to relatively low forward voltage levels and, when adjusted to a low-resistance state, the shunt resistor does not permit forward current to flow through the SCR.

In particular, the invention is an improved SCR containing a variable resistor and a semiconductor switch, all formed upon a semiconductor substrate. The SCR contains a plurality of layers of doped impurities formed on the substrate. The layers form an anode region, an SCR gate region, and a cathode region arranged in a conventional manner upon the substrate. A variable resistance layer also resides on the substrate and conductively connects to the gate region of the SCR to the cathode region. As such, the variable resistance layer forms a variable shunt resistor. A semiconductor switch also residing on the substrate controls the resistance of the variable resistance layer. In this manner, the triggering characteristics of the SCR can be controlled via the semiconductor switch.

More specifically, the invention includes an optically-triggered SCR having a number of semiconductor layers diffused into an N− substrate. The layers form an SCR having a P+ anode region, a P+ gate region, and an N+ cathode region. An adjustable base-shunt resistance, in the form of a P− channel depletion mode metal-oxide-semiconductor field-effect transistor (MOSFET), connects between the gate region and the cathode region. The MOSFET includes a gate region, a P+ drain region, a P− − channel, and a P+ source region. The substrate also contains a PN photodiode which connects to the MOSFET gate region for switching the MOSFET on and off in response to incident optical radiation upon the photodiode. The SCR gate region also includes a layer of photosensitive material. When sufficient optical radiation illuminates the photodiode and the SCR gate region, the MOSFET is turned off and the SCR triggers, permitting anode-to-cathode forward current to flow. When sufficient optical radiation is not present, the MOSFET is turned on and provides a low-resistance shunt path between the SCR gate region and the cathode region which prevents the SCR from triggering.

Another aspect of the invention involves a method of fabricating an improved optically-triggered SCR. The method steps include diffusing doped impurities into a semiconductor substrate to form the improved SCR. The SCR has an anode region, a cathode region, and a gate region. Doped impurities are diffused into the substrate to form a MOSFET having a source region, a drain region, and a channel having a variable resistance. The channel extends between and contacts the source region and the drain region. The drain contacts the SCR gate region. A MOSFET gate region is formed on the substrate in superposition with the variable resistance channel. A switch is formed on the substrate and connects to the MOSFET gate region for turning the MOSFET on and off. The source region is connected to the cathode terminal of the SCR such that the MOSFET forms a variable shunt resistance which is used to prevent SCR triggering under the control of the switch.

BRIEF DESCRIPTION OF THE DRAWINGS

The teachings of the invention can be readily understood by considering the following detailed description in conjunction with the accompanying drawing, in which.

DETAILED DESCRIPTION OF THE DRAWINGS

Figure 1:
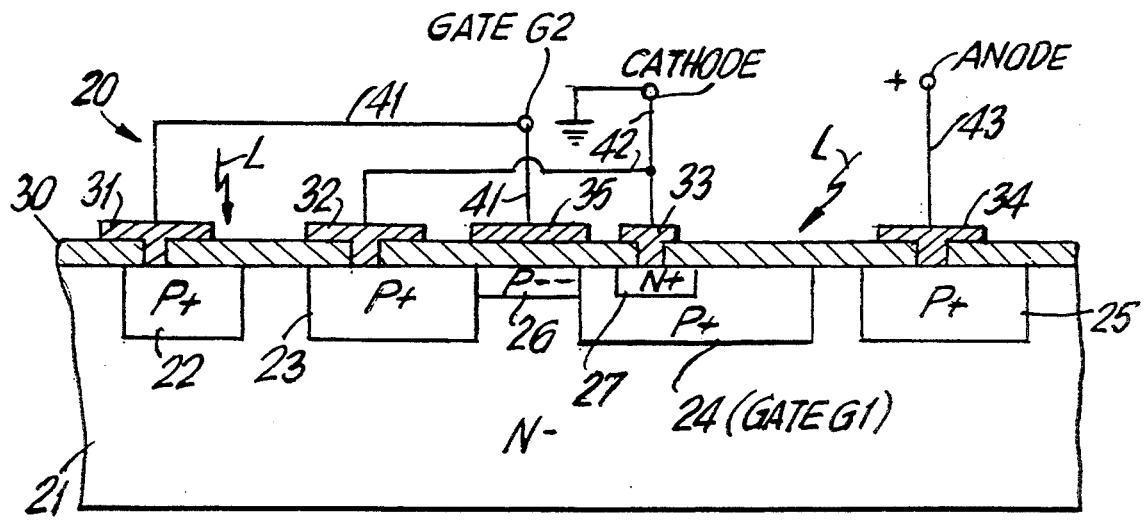
FIG. 1 is a cross-sectional elevation of SCR 20 fabricated in accordance with the present invention.

FIG. 1 shows an integrated circuit (IC) layout for optically-triggered silicon controlled rectifier (SCR) 20 containing an optically adjustable shunt resistor within a single IC. Specifically, SCR 20 is formed on N− substrate 21 in a lateral configuration such that conduction primarily occurs in planes parallel to the broad upper and lower surfaces of substrate 21. The upper surface of substrate 21 is doped with P type impurities to form P+ layers 22-25, and P− − layer 26 which extends between layers 23 and 24. A relatively small region of the upper surface of P+ layer 24 is doped with N type impurities to form N+ layer 27. Insulating layer 30 covers the upper surface of substrate 21. Openings formed in insulating layer 30 using a conventional etching process provide conductive access to doped layers 22, 23, 25 and 27 via conductive contacts 31-34. Specifically, contact 31 connects to P+ layer 22, contact 32 connects to P+ layer 23, contact 33 connects to N+ layer 27 and contact 34 connects to P+ layer 25. The upper surface of insulating layer 30 supports conductive contact 35 directly above P− − layer 26. Conductive lead 41 connects contacts 31 and 35 to gate terminal G2. Conductive lead 42 connects contacts 32 and 33 to the cathode terminal which is normally at ground potential. Conductive lead 43 connects contact 34 to the anode terminal. Accordingly, P+ layer 25 serves as the SCR anode region and N+ layer 27 serves as the SCR cathode region. As will become apparent from the discussion below, P+ layer 24 serves as the SCR gate region.

Figure 2:
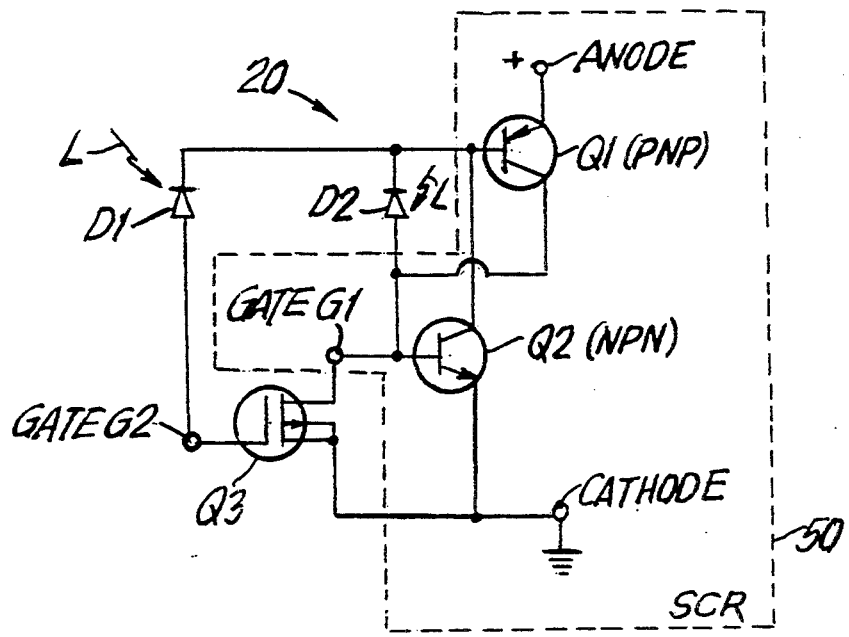
FIG. 2 is a schematic diagram illustrating an equivalent electrical circuit for SCR 20 shown in FIG. 1.

FIG. 2 illustrates an equivalent electrical circuit for improved SCR 20. To best understand the operation of the invention, the reader should simultaneously consult FIGS. 1 and 2. The various layers of SCR 20 in the IC of FIG. 1 essentially form a combination of the following components shown in FIG. 2: two bipolar transistors Q1 and Q2, a P− channel depletion mode metal-oxide-semiconductor field-effect transistor (MOSFET) Q3, and two photodiodes D1 and D2. More specifically, with respect to PNP bipolar transistor Q1, P+ layer 25 forms an emitter region, N− substrate 21 forms a base region, and P+ layer 24 forms a collector region. With respect to NPN bipolar transistor Q2, N− substrate 21 forms a collector region, P+ layer 24 forms a base region, and N+ layer 27 forms an emitter region. The interconnected PNP and NPN transistors form conventional SCR 50. With respect to MOSFET Q3, which functions as a P− channel depletion mode MOSFET, P+ layer 24 forms a source region, P+ layer 23 forms a drain region, P− − layer 26 forms a P channel, and contact 35 forms a gate region. Also, P+ layers 22 and 24 are photosensitive and together with N− substrate 21 form photodiodes D1 and D2, respectively. Insulating layer 30 is substantially transparent. As such, layer 30 passes incident light L such that the P+ photosensitive layers 22 and 24 may be illuminated for triggering SCR 20 in a manner to be described in detail below.

Some layers perform several roles in the IC. Specifically, P+ layer 24, which forms the SCR gate region, also functions as the base region of NPN transistor Q2, the collector region of PNP transistor Q1, the source region of MOSFET Q3, the photosensitive layer of photodiode D2, and the gate terminal G1. Also, N− substrate 21 functions as the substrate of MOSFET Q3, the base region of PNP transistor Q1, and the collector region of NPN transistor Q2.

As mentioned above, SCR 20 operates as an optically-triggered SCR having an optically adjustable shunt resistor. In this regard, layers 24 (gate region), 25 (anode region), and 27 (cathode region), and substrate 21 function as conventional SCR 50. MOSFET Q3 serves as an adjustable shunt resistor for the SCR. Specifically, MOSFET Q3 connects to gate terminal G1 and serves as an adjustable base- shunt resistor for the base-emitter junction of NPN transistor Q2. Diode D1 performs as an optical switch for turning MOSFET Q3 on and off in response to incident optical radiation. With respect to the SCR trigger, diode D2 acts as an optical trigger for the SCR, i.e., diode D2 generates gate current when illuminated.

The specific operation of optically-triggered SCR 20 will now be described, first with reference to its equivalent circuit in FIG. 2 and then with reference to the IC layout of FIG. 1. When properly triggered, via the presence of incident optical radiation L, SCR 20 operates to conduct current between the positive anode terminal and grounded cathode terminal via transistors Q1 and Q2. Such anode-to-cathode conduction occurs when sufficient radiation L is incident on both diodes D1 and D2 to turn both diodes on simultaneously. Specifically, when diode D1 turns on, gate terminal G2 becomes more positive than the cathode terminal. In response, MOSFET Q3 turns off and produces a high-resistance path, e.g., millions of ohms, from gate terminal G1 through the MOSFET to the cathode terminal. With diode D2 also turned on and MOSFET Q3 off, gate terminal G1 becomes more positive than the cathode terminal, causing the emitter-base junction of transistor Q2 to be forward biased, which turns transistor Q2 on. Since gate terminal G1 connects to the collector of transistor Q1, the collector-base junction of transistor Q1 also becomes forward biased, which turns transistor Q1 on. As such, a positive voltage on gate terminal G1 triggers SCR 20, i.e., permits anode-to-cathode current to flow, as long as the cathode terminal is negative with respect to gate terminal G1 and the anode terminal, and the anode terminal is positive with respect to gate terminal G1. When the positive potential on gate terminal G1 is removed, which occurs when radiation L is removed, SCR 20 continues to conduct anode-to-cathode (forward) current. Only by reducing the voltage on the anode terminal to near ground or removing it completely will anode-to-cathode current cease. Simply stated, once SCR 20 is triggered by the incident optical radiation L, removal of that incident radiation from diodes D1 and D2 has no effect on SCR operation. As with any conventional SCR, SCR 20 only turns off when the forward current falls below the holding current.

When improved SCR 20 is off, i.e., not conducting forward current, and radiation L is not present or is insufficient to cause the diodes to sufficiently conduct to trigger the SCR, MOSFET Q3 operates to prevent false triggering. Specifically, when diode D1 is off, MOSFET Q3 turns on and provides a low-resistance shunt path, e.g., tens of ohms, between the base of transistor Q2 and the cathode terminal. This low-resistance shunt prevents gate terminal G1 from becoming sufficiently positive with respect to the cathode terminal to forward bias the base-emitter junction of transistor Q2. As such, transistor Q2 remains off. Consequently, MOSFET Q3 serves to "hold off" SCR triggering by preventing positive gate voltages at gate G1 from turning on transistor Q2.

With respect to FIG. 1, SCR operation begins with the presence of incident radiation L at layers 22 and 24, and a positive voltage on the anode terminal. This condition forward biases the PN junctions formed between N− substrate 21 and P+ layers 22, 24 and 25. Photocurrent in P+ layer 22, generated by radiation L, causes gate contact 35 to become positive via contact 31, conductor 41, and gate terminal G2. The positive voltage on gate contact 35 depletes carriers in the P channel formed by P− − layer 26, thereby blocking conduction between layers 24 and 23. This equates to switching off MOSFET Q3 in FIG. 2.

The junction formed by P+ layer 24 and N+ layer 27 is now forward biased. As a result of the photocurrent produced in P+ layer 24, gate current flows, via N+ layer 27, between P+ layer 24 and the cathode terminal. Consequently, SCR 20 triggers, permitting forward current to flow between the anode and cathode terminals via conductor 43, contact 34, P+ layer 25, N− substrate 21, P+ layer 24, N+ layer 27, contact 33, and conductor 42.

When radiation L is not present and there is no forward current, the low-resistance base-shunt path of P− − layer 26 prevents forward bias of the PN junction between P+ layer 24 and N+ layer 27, thereby blocking SCR triggering. Specifically, with no radiation L present, the P channel provided by P− − layer 26 remains highly conductive, providing a low-resistance base-shunt path between P+ layer 24 and ground via P+ layer 23, contact 32, conductor 42, and the cathode terminal. The specific value of the shunt resistance is determined by application specific design parameters such as the size and depth of layer 26. However, typically, during the low-resistance state, the shunt resistance will have a value on the order of tens of ohms. As such, any stray carriers that may be induced or otherwise generated in P+ layer 24 will not trigger SCR 20 because such carriers will be shunted to ground via this low-resistance base-shunt path. Consequently, the PN junction between P+ layer 24 and N+ layer 27 will remain reverse biased and block forward current between the anode and cathode terminals.

In summary, externally controlled MOSFET Q3 makes SCR 20 very sensitive, i.e., the SCR is easily turned on, when the MOSFET is adjusted to a high-resistance state and holds the SCR off when the MOSFET is adjusted to a low-resistance state. In this manner, MOSFET Q3 serves as a variable-resistance device for preventing false triggering of SCR 20.

FIG. 1 shows conductors 41–43 extending above the IC structure to provide a schematic representation of the desired electrical connections. In practice, however, electrical connections on an IC are typically fabricated by forming a film of conductive material in a particular pattern on the IC device in a manner well known to those skilled in these arts.

A fabrication method for optically-triggered SCR 20 includes the following steps:

A. lightly doping a silicon wafer with N type impurities to form N− substrate 21;

B. diffusing P type impurities into the upper surface of substrate 21 to form P+ layers 22–25 and P− − layer 26;

C. diffusing N type impurities into a small region of the upper surface of P+ layer 24 to form N+ layer 27;

D. forming silicon oxide on the upper surface of substrate 21 to form insulating layer 30;

E. etching openings in layer 30 adjacent layers 22, 23, 25, and 27; and

F. depositing conductive material to form a pattern of conductors on the upper surface to form contacts 31–35 and conductors 41–43.

Obviously many modifications and variations of the present invention are possible in the light of the above teachings. It is to be understood, therefore, that within the scope of the appended claims, the invention may be practiced otherwise than as specifically described.

What is claimed is:

1. An improved SCR comprising:
   a semiconductor substrate (21) having a plurality of layers with doped impurities located on said substrate;
   an anode layer (25) formed in said substrate;

an SCR gate layer (24) formed in said substrate laterally spaced from said anode layer;
a cathode layer (27) formed in said SCR gate layer;
a variable resistance layer (26), having an adjustable resistance, formed on said substrate laterally adjacent said SCR gate layer and conductively connected to said SCR gate layer; and
means for adjusting (22, 35) said adjustable resistance.

2. The improved SCR of claim 1 wherein said adjusting means comprises a first layer (22) of photosensitive material, said adjusting means adjusting said adjustable resistance in response to the presence of incident optical radiation on said first layer of photosensitive material.

3. The improved SCR of claim 2 further comprising a MOSFET (Q3) formed on said substrate, said MOSFET having a source region (24), a MOSFET gate region (35), a channel (26), and a drain region (23), and wherein said channel includes said variable resistance layer.

4. The improved SCR of claim 3 wherein said first layer of photosensitive material connects to said MOSFET gate region, and said adjusting means adjusts said adjustable resistance to a low-resistance state in the absence of said incident optical radiation and a high-resistance state in the presence of said incident optical radiation.

5. The improved SCR of claim 4 wherein said SCR gate layer comprises a second layer (24) of photosensitive material responsive to said incident optical radiation, and wherein said SCR gate layer, said adjusting means, and said MOSFET include means for triggering said SCR such that forward current flows between said anode layer and said cathode layer when said incident optical radiation illuminates said first and second layers of photosensitive material, and such that the flow of forward current is blocked when said incident optical radiation does not illuminate said first and second layers of photosensitive material.

6. The improved SCR of claim 1 further comprising a MOSFET (Q3) formed on said substrate, said MOSFET having a source region (24), a MOSFET gate region (35), a channel (26) and a drain region (23), and wherein said channel includes said variable resistance layer.

7. An improved SCR (20) comprising:
a semiconductor substrate (21) of N type material having a plurality of layers with doped impurities located on said substrate;
a P+ anode layer (25) formed in said substrate;
a P+ gate layer (24) formed in said substrate laterally spaced from said P+ anode layer;
a N+ cathode layer (27) formed in said P+ gate layer;
a variable resistance layer (26), having an adjustable resistance, formed on said substrate laterally adjacent said P+ gate layer and conductively connected to said P+ gate layer; and
means for adjusting (22, 35) said adjustable resistance, said means including a PN diode (22, 21) having on and off states, formed on said substrate.

8. The improved SCR of claim 7 wherein said adjusting means adjusts said adjustable resistance to a high-resistance state when said diode is in said on state and to a low-resistance state when said diode is in said off state.

9. The improved SCR of claim 8 further comprising a P-channel depletion mode MOSFET (24, 23, 26, 35) formed on said substrate, said MOSFET having a P+ source region (24), a MOSFET gate region (35), a P channel (26), and a P+ drain region (23), and wherein said P channel includes said variable resistance layer, and said PN diode connects to said P+ gate layer.

10. The improved SCR of claim 11 wherein said P+ gate layer and said PN diode each include a layer (22, 24) of photosensitive material responsive to incident optical radiation, said P+ gate layer, said adjusting means, and said MOSFET having means for triggering said SCR such that forward current flows between said P+ anode layer and said N+ cathode layer when said incident optical radiation illuminates said layers of photosensitive material, and such that the flow of forward current is blocked when said incident optical radiation does not illuminate said layers of photosensitive material.

11. The improved SCR of claim 7 further comprising a P-channel depletion mode MOSFET (24, 23, 26, 35) formed on said substrate, said MOSFET having a P+ source region (24), a MOSFET gate region (35), a P channel (26), and a P+ drain region (23), and wherein said P channel includes said variable resistance layer, and said PN diode connects to said P+ gate layer.

12. The improved SCR of claim 11 wherein said P+ gate layer and said PN diode each include a layer (22, 24) of photosensitive material responsive to incident optical radiation, said P+ gate layer, said adjusting means, and said MOSFET having means for triggering said SCR such that forward current flows between said p+ anode layer and said N+ cathode layer when said incident optical radiation illuminates said layers of photosensitive material, and such that the flow of forward current is blocked when said incident optical radiation does not illuminate said layers of photosensitive material.

13. A method for activating an improved SCR that has a semiconductor substrate having a plurality of layers with doped impurities located on said substrate, said layers forming an anode region on said substrate, an SCR gate region on said substrate laterally spaced from said anode region and a cathode region in said SCR gate region; a variable resistance layer, having an adjustable resistance, formed on said substrate laterally adjacent said SCR gate region and conductively connected to said SCR gate region; and at least one control layer, conductively connected to said variable resistance layer, for adjusting said resistance in response to optical radiation, comprising the steps of:
applying a voltage to said anode region;
applying a voltage to said gate region; and
illuminating said control layer to control said resistance of said variable resistance layer such that said improved SCR conducts current from said anode region to said cathode region.

14. The method of claim 13 wherein said improved SCR further has a MOSFET formed on said substrate, said MOSFET comprising a source region, a MOSFET gate region, a channel having a variable resistance and a drain region, wherein said control layer contains a photosensitive material and connects to said MOSFET gate region, and wherein said illuminating step further comprises the step of adjusting the resistance of said channel to have a high-resistance.

15. The method of claim 14 wherein said control layer forms a photosensitive diode on said substrate laterally spaced from said resistance layer.

16. A method of triggering an SCR having a semiconductor substrate, an anode region formed on said substrate, a gate region formed on said substrate laterally spaced from said anode region, and a cathode region formed in said gate region, comprising the steps of:
  (a) electrically connecting between the gate region and the cathode region of the SCR a variable resistance, having a high resistance state and a low resistance state, formed, in part, by the gate region and, in part, on the substrate laterally spaced from the gate region;
  (b) electrically connecting the variable resistance to a switch element that is formed, in part, on the substrate laterally spaced from the variable resistance and that, in response to an external signal, switches the variable resistance to a high resistance state;
  (c) applying a voltage to the anode terminal of the SCR;
  (d) applying a voltage to the gate terminal of the SCR;
  (e) applying an external signal to the switch element to switch the variable resistance to a high resistance state and cause current to conduct from the anode terminal to the cathode terminal of the SCR.

17. The method of claim 16, wherein the variable resistance is a MOSFET.

18. The method of claim 17, wherein the switch element is an optical switch that, in response to incident optical radiation thereon, switches the MOSFET to a high resistance state; and the step of applying an external signal comprises illuminating the optical switch to switch the MOSFET to a high resistance state and cause current to conduct from the anode terminal to the cathode terminal of the SCR.

* * * * *